United States Patent
Govindarajan

(10) Patent No.: US 7,611,972 B2
(45) Date of Patent: Nov. 3, 2009

(54) SEMICONDUCTOR DEVICES AND METHODS OF MANUFACTURE THEREOF

(75) Inventor: Shrinivas Govindarajan, Austin, TX (US)

(73) Assignee: Qimonda North America Corp., Cary, NC (US)

( * ) Notice: Subject to any disclaimer, the term of this patent is extended or adjusted under 35 U.S.C. 154(b) by 120 days.

(21) Appl. No.: 11/606,812

(22) Filed: Nov. 29, 2006

(65) Prior Publication Data

US 2008/0121963 A1 May 29, 2008

(51) Int. Cl.
*H01L 21/322* (2006.01)
*H01L 21/31* (2006.01)

(52) U.S. Cl. .................... 438/476; 438/763; 438/785; 257/E21.317; 257/E21.318

(58) Field of Classification Search ............... 438/476, 438/763, 785
See application file for complete search history.

(56) References Cited

U.S. PATENT DOCUMENTS

| | | | |
|---|---|---|---|
| 6,563,182 B2 * | 5/2003 | Horikawa | 257/405 |
| 6,683,004 B1 * | 1/2004 | Inoue et al. | 438/692 |
| 6,921,691 B1 | 7/2005 | Li et al. | |
| 2002/0135030 A1 | 9/2002 | Horikawa | |
| 2005/0205896 A1 | 9/2005 | Li et al. | |
| 2005/0255699 A1 * | 11/2005 | Jones et al. | 438/683 |
| 2005/0280104 A1 | 12/2005 | Li | |
| 2005/0282329 A1 | 12/2005 | Li | |
| 2006/0244035 A1 * | 11/2006 | Bojarczuk et al. | 257/314 |
| 2007/0128763 A1 * | 6/2007 | Tomino et al. | 438/99 |

OTHER PUBLICATIONS

Deloach, J.D., et al., "Growth-Controlled Cubic Zirconia Microstructure in Zirconia—Titania Nanolaminates," J. Vac. Sci. Technol. A 20(5), Sep./Oct. 2002, pp. 1517-1524.
Qadri, S.B., et al., "Structural Stability of $ZrO_2$—$Al_2O_3$ Thin Films Deposited by Magnetron Sputtering," J. Vac. Sci. Technol. A 7 (3), May/Jun. 1989, pp. 1220-1224.
Sayan, S., et al., "Thermal Decomposition Behavior of the $HfO_2$/$SiO_2$/Si System," Journal of Applied Physics, vol. 94, No. 2, Jul. 15, 2003, pp. 928-934.
Scanlan, C.M., et al., "Tetragonal Zirconia Growth by Nanolaminate Formation," Appl. Phys. Lett., vol. 64, No. 26, Jun. 27, 1994, pp. 3548-3550.
Cartier, E., et al., "Role of Oxygen Vacancies in $V_{FB}$/$V_t$ Stability of pFET Metals on $HfO_2$," 2005 Symposium on VLSI Technology Digest of Technical Papers, 12B-3, 2005, pp. 230-231.
Gavartin, J.L., et al., "Negative Oxygen Vacancies in $HfO_2$ as Charge Traps in High-κ Stacks," Applied Physics Letters, vol. 89, No. 8, 2006, pp. 082908-1-082908-3.

(Continued)

*Primary Examiner*—Alexander G Ghyka
(74) *Attorney, Agent, or Firm*—Slater & Matsil, L.L.P.

(57) ABSTRACT

Semiconductor devices and methods of manufacture thereof are disclosed. A preferred embodiment comprises a method of forming an insulating material layer. The method includes forming a barrier layer and forming a rare earth element-containing material layer over the barrier layer.

6 Claims, 4 Drawing Sheets

OTHER PUBLICATIONS

Ruzyllo, J., "Semiconductor OneSource: Semiconductor Materials," http://www.semi1source.com/materials/ downloaded Feb. 12, 2007, 2 pages.

Li, P., et al., "Effect of Dopants on Zirconia Stabilization—An X-ray Absorption Study: I, Trivalent Dopants," J. Am. Ceram. Soc., vol. 77, No. 1, 1994, pp. 118-128.

Wang, J., et al., "Review Hafnia and Hafnia-Toughened Ceramics," Journal of Materials Science, vol. 27, 1992, pp. 5397-5430.

Van Dover, R.B., "Amorphous Lanthanide-Doped $TiO_x$ Dielectric Films," Applied Physics Letters, vol. 74, No. 20, May 17, 1999, pp. 3041-3043.

Narayanan, V., et al., "Interfacial Oxide Formation and Oxygen Diffusion in Rare Earth Oxide—Silicon Epitaxial Heterostructures," Applied Physics Letters, vol. 81, No. 22, Nov. 25, 2002, pp. 4183-4185.

Chen, S., et al., "Superior Electrical Properties of Crystalline $Er_2O_3$ Films Epitaxially Grown on Si Substrates," Applied Physics Letters, vol. 88, No. 22, 2006, pp. 222902-1-222902-3.

Lee, H., et al., "Electrical Characteristics of a Dy-Doped $HfO_2$ Gate Dielectric," Applied Physics Letters, vol. 79, No. 16, Oct. 15, 2001, pp. 2615-2617.

Fissel, A., et al., "Interface Formation during Molecular Beam Epitaxial Growth of Neodymium Oxide on Silicon," Journal of Applied Physics, vol. 99, No. 7, 2006, pp. 074105-1-074105-6.

Wagner, M., et al., "Gadolinium Scandate Thin Films as an Alternative Gate Dielectric Prepared by Electron Beam Evaporation," Applied Physics Letters, vol. 88, No. 17, 2006, pp. 172901-1-172901-3.

Zhao, C., et al., "Ternary Rare-Earth Metal Oxide High-κ Layers on Silicon Oxide," Applied Physics Letters, vol. 86, No. 13, 2005, pp. 132903-1-132903-3.

Ono, H., et al., "Interfacial Reactions between Thin Rare-Earth-Metal Oxide Films and Si Substrates," Applied Physics Letters, vol. 78, No. 13, Mar. 26, 2001, pp. 1832-1834.

"Lanthanide," Wikipedia, http://en.wikipedia.org/wiki/Lanthanide, downloaded Nov. 28, 2006, 2 pages.

"Transition Metal," Wikipedia, http://en.wikipedia.org/wiki/Transition_metal, downloaded Nov. 28, 2006, 5 pages.

"Rare Earth Element," Wikipedia, http://en.wikipedia.org/wiki/Rare_earth_element, downloaded Nov. 28, 2006, 1 page.

Wilk, G.D., et al., "High-κ Gate Dielectrics: Current Status and Materials Properties Considerations," Journal of Applied Physics, Applied Physics Review, vol. 89, No. 10, May 15, 2001, pp. 5243-5275.

Koike, M., et al., "Effect of Hf-N Bond on Properties of Thermally Stable Amorphous HfSiON and Applicability of this Material to Sub-50nm Technology Node LSIs," IEEE, Mar. 2003, 4 pages.

Christen, H.M., et al., "Dielectric and Optical Properties of Epitaxial Rare-Earth Scandate Films and Their Crystallization Behavior," Applied Physics Letters, vol. 88, No. 26, 2006, pp. 262906-1-262906-3.

Edge, L.F., et al., "Thermal Stability of Amorphous $LaScO_3$ Films on Silicon," Applied Physics Letters, vol. 89, No. 6, 2006, pp. 062902-1-062902-3.

Sivasubramani, P., et al., "Outdiffusion of La and Al from Amorphous $LaAlO_3$ in Direct Contact with Si (001)," Applied Physics Letters, vol. 86, No. 20, 2005, pp. 201901-1-201901-3.

Kim, K.H., et al., "Atomic Layer Deposition of Gadolinium Scandate Films with High Dielectric Constant and Low Leakage Current," Applied Physics Letters, vol. 89, No. 13, 2006, pp. 133512-133512-3.

Edge, L.F., et al., "Suppression of Subcutaneous Oxidation during the Deposition of Amorphous Lanthanum Aluminate on Silicon," Applied Physics Letters, vol. 84, No. 23, Jun. 7, 2004, pp. 4629-4631.

* cited by examiner

SEMICONDUCTOR DEVICES AND METHODS OF MANUFACTURE THEREOF

TECHNICAL FIELD

The present invention relates generally to the fabrication of semiconductors, and more particularly to high dielectric constant insulating materials and methods of formation thereof.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

Insulating materials comprise dielectric materials that are used in many types of semiconductor devices. Silicon dioxide ($SiO_2$) is a common dielectric material used in semiconductor device manufacturing, for example, which has a dielectric constant or k value of about 3.9. Some semiconductor applications require the use of a high k dielectric material having a higher k value than the k value of silicon dioxide, for example. Some transistors require a high k dielectric material as a gate dielectric material, and some capacitors require a high k dielectric material as an insulating material between two conductive plates, as examples, to reduce leakage current and reduce capacitance.

A dynamic random access memory (DRAM) is a memory device that can be used to store information. A DRAM cell in a memory array typically includes two elements, namely a storage capacitor and an access transistor. Data can be stored into and read out of the storage capacitor by passing a charge through the access transistor and into the capacitor. The capacitance, or amount of charge held by the capacitor per applied voltage, is measured in farads and depends upon the area of the plates, the distance between them, and the dielectric value of the insulator, as examples.

High k dielectric materials are typically used as an insulating material in the storage capacitor of DRAM cells. Examples of some high dielectric constant materials that have been proposed as capacitor dielectric materials are hafnium oxide and hafnium silicate. However, these materials are limited to a maximum dielectric constant of around 30, for example.

What are needed in the art are improved high dielectric constant (k) dielectric materials and methods of formation thereof in semiconductor devices.

SUMMARY OF THE INVENTION

These and other problems are generally solved or circumvented, and technical advantages are generally achieved, by preferred embodiments of the present invention, which provide improved methods of forming high k dielectric materials and structures thereof.

In accordance with a preferred embodiment of the present invention, a method of forming an insulating material layer includes forming a barrier layer, and forming a rare earth element-containing material layer over the barrier layer.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely the formation of high k dielectric materials in semiconductor devices such as capacitors and transistors. The invention may also be applied, however, to the formation of dielectric materials in other applications where a high k dielectric material is required, for example.

Embodiments of the present invention achieve technical advantages by providing novel processing solutions for the formation of high k dielectric materials. The novel dielectric materials to be described herein have a high k value, a low leakage current, good uniformity, and high temperature thermal stability.

Figure 1:
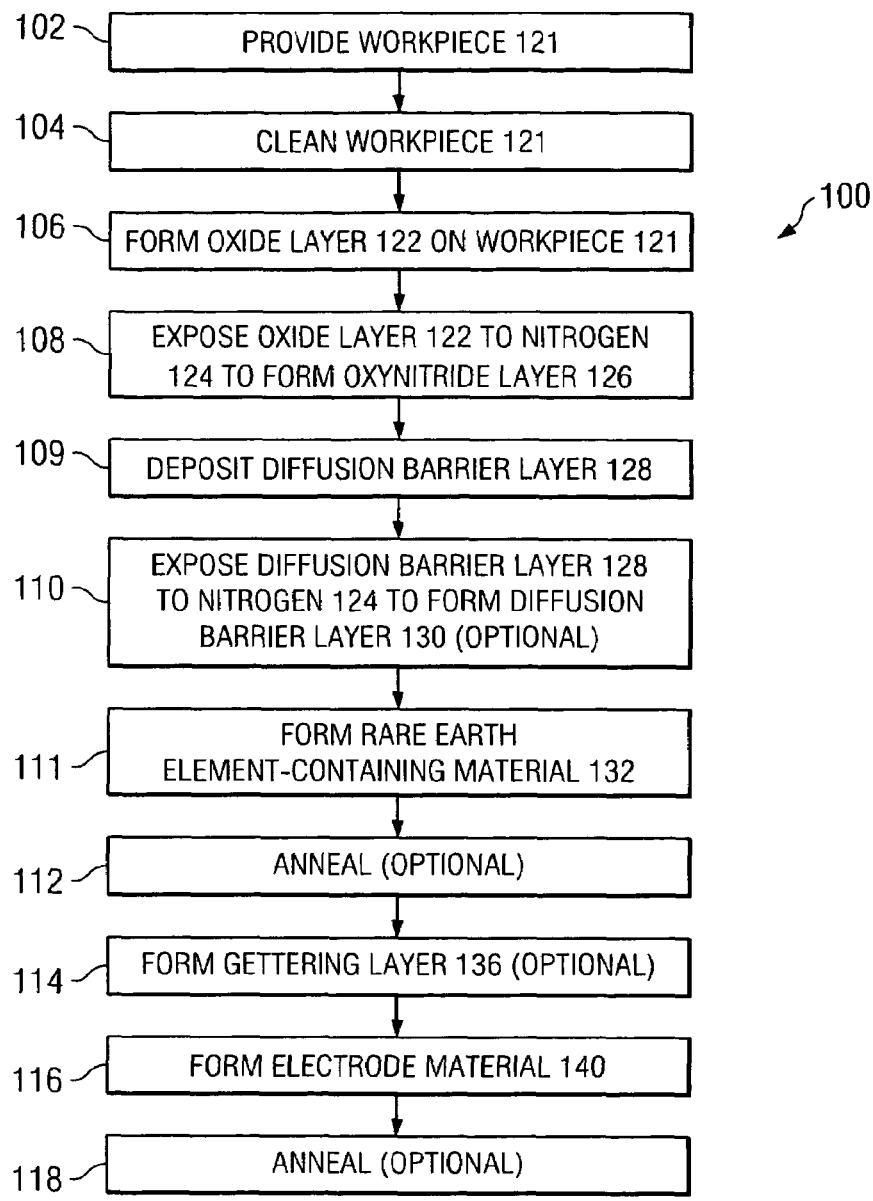
FIG. 1 is a flow chart illustrating a method of forming a high k dielectric material in accordance with a preferred embodiment of the present invention, wherein the high k dielectric material comprises a barrier layer and a rare earth element-containing material layer disposed over the barrier layer material.
Figure 4:
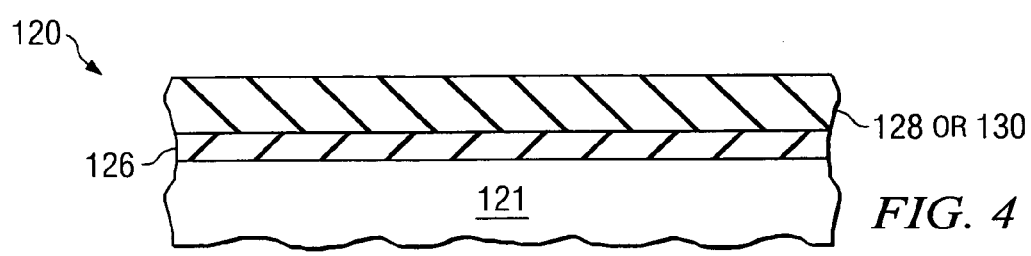
Figure 5:
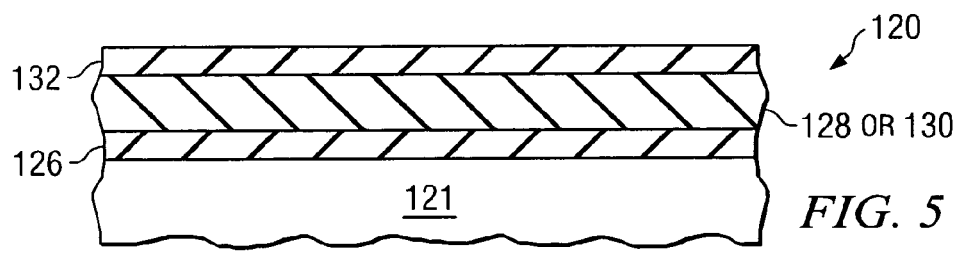

FIG. 1 is a flow chart 100 illustrating a method of forming a high k dielectric material in a semiconductor device 120 (see FIG. 2) in accordance with a preferred embodiment of the present invention, wherein the high k dielectric material comprises a barrier layer 128 or 130 and a rare earth element-containing material 132 disposed over the barrier layer 128 or 130 (see FIG. 5). FIGS. 2 through 7 show cross-sectional views of a semiconductor device 120 in accordance with an embodiment of the present invention at various stages of manufacturing, wherein the high k dielectric material is formed on a planar semiconductor device 120.

Figure 2:
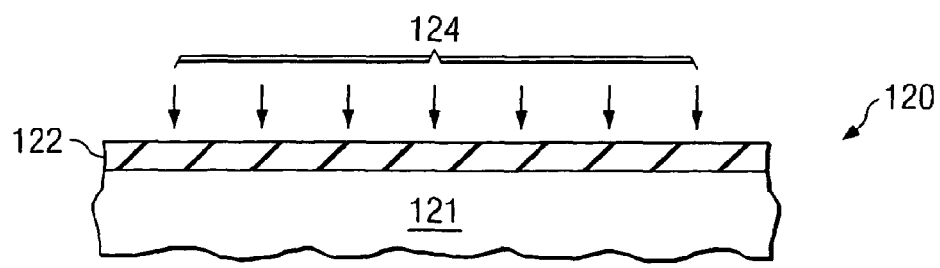
FIGS. 2 through 7 show cross-sectional views of a semiconductor device in accordance with an embodiment of the present invention at various stages of manufacturing.

Referring to the flow chart 100 in FIG. 1 and also to the semiconductor device 120 shown in FIG. 2, first, a workpiece 121 is provided (step 102). The workpiece 121 may include a semiconductor substrate comprising silicon or other semiconductor materials covered by an insulating layer, for example. The workpiece 121 may also include other active components or circuits, not shown. The workpiece 121 may comprise silicon oxide over single-crystal silicon, for example. The workpiece 121 may include other conductive layers or other semiconductor elements, e.g., transistors, diodes, etc. Compound semiconductors, GaAs, InP, Si/Ge, or SiC, as examples, may be used in place of silicon. The workpiece 121 may comprise a silicon-on-insulator (SOI) substrate, for example.

The workpiece 121 is cleaned (step 104). For example, the workpiece 121 may be cleaned to remove debris, native oxide, and/or contaminants. In a preferred embodiment, the workpiece 121 is cleaned with ozone ($O_3$), for example, which may result in the formation of a chemical oxide layer. The cleaning step 104 preferably results in a good interface for the subsequent deposition of thin dielectric material layers thereon, for example.

Preferably, although optionally, the cleaning step 104 may result in the formation of an oxide layer 122 comprising an oxide material such as silicon dioxide ($SiO_2$) over the workpiece 121, as shown in FIG. 2. Alternatively, the optional oxide layer 122 may be formed using an optional additional oxidation or deposition step (step 106), and the oxide layer 122 may also comprise other materials, for example. The oxide layer 122 preferably comprises a thickness of about 10 Angstroms or less, for example, although alternatively, the oxide layer 122 may comprise other dimensions.

Figure 3:
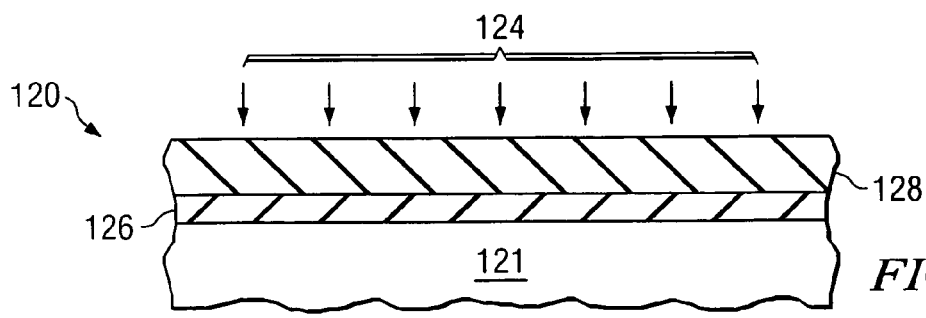

The workpiece 121, e.g., the oxide layer 122 formed on the top surface of the workpiece 121, is preferably exposed to a nitrogen-containing ambient 124 as shown in FIG. 2 to form an oxynitride layer 126 from the oxide layer 122, as shown in FIG. 3 (step 108 of FIG. 1). The nitrogen-containing ambient 124 includes nitrogen (N), for example. The oxynitride layer 126 shown in FIG. 3 preferably comprises a silicon oxynitride ($SiO_xN_y$) layer 126 that is formed from an oxide layer 122 comprising $SiO_2$, for example, although alternatively, the oxynitride layer 126 may comprise other materials.

Next, a diffusion barrier layer 128 is formed over the oxynitride layer 126, as shown in FIG. 3 (step 109). The diffusion barrier layer 128 is also referred to herein as a diffusion barrier material or a barrier layer, for example. The diffusion barrier layer 128 functions as a diffusion barrier and also as an oxidation barrier or a reaction barrier, for example, in some embodiments. The diffusion barrier layer 128 is also referred to herein as a reaction-cum-diffusion barrier layer, because in some embodiments, the diffusion barrier layer 128 prevents a reaction of a subsequently-deposited material with the material layers beneath the diffusion barrier layer 128, and the diffusion barrier layer 128 also prevents a diffusion of a subsequently-deposited material with the material layers beneath the diffusion barrier layer 128, for example.

The barrier layer 128 preferably comprises $HfO_2$, $HfSiO$, or $Al_2O_3$, as examples, although the barrier layer 128 may comprise other insulating materials. The barrier layer 128 is preferably formed by atomic layer deposition (ALD), e.g., by depositing one or more layers of the barrier layer 128 material using ALD. Alternatively, the barrier layer 128 may be formed using other deposition methods, such as chemical vapor deposition (CVD), physical vapor deposition (PVD), pulsed laser deposition (PLD), or molecular beam epitaxy (MBE), as examples, depending on the substrate topography, for example. The barrier layer 128 preferably comprises a thickness of about 50 Angstroms or less, and more preferably comprises a thickness of about 20 Angstroms or less in some embodiments, as examples. Alternatively, the barrier layer 128 may comprise other dimensions.

The barrier layer 128 may be exposed to a nitrogen-containing ambient 124, as shown in FIG. 3. This step 110 is optional but is preferably included in some embodiments of the present invention. Exposing the diffusion barrier layer 128 to the nitrogen-containing ambient 124 may include exposing the barrier layer 128 to a nitrogen-containing gas or liquid such as $N_2$ or $NH_3$, exposing the barrier layer 128 to a plasma nitridation process, exposing the barrier layer 128 to a thermal nitridation process, or using an implantation process, as examples. A thermal nitridation process may comprise exposing the barrier layer 128 to $NH_3$ at a temperature of about 600 to 800 degrees C. for about 10 to 60 seconds at a pressure of about 20 to 60 Torr, for example, although other processing parameters may also be used. The optional nitridation step 108 of the diffusion barrier layer 128 advantageously forms a diffusion barrier layer 130 that is heavily nitrided (e.g., forming a nitrided barrier layer 130), which densifies the barrier layer 128. If a plasma nitridation process or implantation process is used, the barrier layer 128 may be nitrided only at a top surface thereof, for example, not shown.

After the barrier layer 128 is formed and is optionally nitrided to form a nitrided barrier layer 130, as shown in FIG. 4, a rare earth element-containing material layer 132 is formed over the barrier layer 128 or over the nitrided barrier layer 130, as shown in FIG. 5 (step 111). The rare earth element-containing material layer 132 is also referred to herein as a rare earth element-containing material, a rare earth element-containing layer, or a rare earth element-containing insulating material layer, as examples. The rare earth element-containing material layer 132 may be formed by ALD, PVD, MBE, or PLD, as examples, although other deposition methods may also be used. The thickness of the rare earth element-containing material layer 132 may comprise about 100 Angstroms or less, for example, although the thickness may comprise other dimensions. The targeted thickness of the rare earth element-containing material layer 132 may be a function of the required effective oxide thickness (EOT) and leakage specifications for the particular semiconductor device 120, for example.

The rare earth element-containing material layer 132 preferably comprises at least one rare earth element, and more preferably comprises two rare earth elements in some embodiments, for example. The rare earth element-containing material layer 132 preferably comprises an oxide of at least one rare earth element in other embodiments. The rare earth element-containing material layer 132 may be doped with the at least one rare earth element or doped with an oxide of the at least one rare earth element, for example.

The at least one rare earth element of the rare earth element-containing material layer 132 preferably comprises Scandium (Sc), Yttrium (Y), and/or an element in the Lanthanide series of the periodic table of elements, as examples. The at least one rare earth element of the rare earth element-containing material layer 132 may comprise Lanthanum (La), Cerium (Ce), Praseodymium (Pr), Neodymium (Nd), Promethium (Pm), Samarium (Sm), Europium (Eu), Gadolinium (Gd), Terbium (Th), Dysprosium (Dy), Holmium (Ho), Erbium (Er), Thulium (Tm), Ytterbium (Yb), and/or Lutetium (Lu), for example.

In some embodiments, the rare earth element-containing material layer 132 comprises at least one rare earth element and at least one transition metal. The at least one transition metal may be combined with an oxide of the at least one rare earth element, for example. The at least one transition metal of the rare earth element-containing layer 132 may comprise at least one transition metal comprised of Titanium (Ti), Zirconium (Zr), Niobium (Nb), Hafnium (Hf), Tantalum (Ta), and/or Tungsten (W), as examples, although other transition metals may also be used. The rare earth element-containing layer 132 may comprise an oxide of the at least one transition metal, for example.

The rare earth element-containing layer 132 may be formed by several methods. An oxide of a rare earth element may be deposited and doped with a transition metal after or during the deposition process, for example. As one example, a rare earth oxide comprising at least one rare earth element, e.g., comprising Sc, Y, or La through Lu (e.g., element numbers 57 through 71 of the periodic table) may be deposited and doped with one or more transition metals such as Ti, Ta, or other transition metals. The rare earth oxide may comprise a ternary rare earth oxide $RE_1RE_2O_3$, wherein two different rare earth elements $RE_1$ and $RE_2$ are combined with oxygen to form the ternary rare earth oxide, for example. The rare earth oxide preferably comprises a scandate such as $GdScO_3$ or $DyScO_3$, in some embodiments, as examples, although other scandates may also be used. Multiple layers of rare earth oxides may be used for the rare earth element-containing layer 132. As one example, the rare earth element-containing layer 132 may comprise a first layer of a scandate and a second layer of a rare earth based Ti or Ta oxide formed over the first layer.

Alternatively, to form the rare earth element-containing layer 132, an oxide of a transition metal may be deposited and doped with a rare earth element after or during the deposition process, for example. As one example, a transition metal oxide comprising at least one material layer comprising $TiO_2$, $Ta_2O_5$, or a bilayer of $TiO_2$ and $Ta_2O_5$, or other transition metals, combinations or multiple layers thereof, may be deposited. The at least one material layer is then doped with a rare earth oxide comprising one or more rare earth elements. In these embodiments, doping the at least one material layer of the rare earth element-containing layer 132 with the rare earth element may comprise doping the at least one material layer with a rare earth oxide. Doping the at least one material layer with the rare earth oxide preferably comprises doping the at least one material layer with about 30% or less of at least one rare earth oxide, for example, in some embodiments, although other percentages of the rare earth element and/or rare earth oxide may also be introduced into the at least one material layer.

As another example, the rare earth element-containing layer 132 may be formed by depositing hafnium oxide or zirconium oxide doped with about 30% or less of the rare earth element. There may be an optimal doping level for the rare earth element, depending on the rare earth element, e.g., comprising a range of between about 10 to 20% for some rare earth elements, where an optimal combination of high dielectric constant and low leakage can be achieved in accordance with embodiments of the present invention. The doping level % of the rare earth element into the transition metal oxide may comprise about 50% or less, or greater than 50%, in other embodiments, for example. As an example, the rare earth element-containing layer 132 may comprise hafnium oxide ($HfO_2$) doped with about 10% (e.g., by atomic weight) of Dy or other amounts of other rare earth elements.

Advantageously, a high dielectric constant may be obtained by stabilizing a tetragonal or cubic phase of hafnium oxide or zirconium oxide, for example, because the tetragonal or cubic phase of these oxides have a significantly higher dielectric constant than the monoclinic phase, advantageously.

The rare earth element-containing layer 132 may then be subjected to an optional anneal process (step 112). During the anneal process, nitrogen may optionally be introduced to form a nitrided layer at a top surface of the diffusion barrier layer 128 or 130 (not shown). The anneal process preferably comprises annealing the workpiece 121 at a temperature of between about 500 and 850 degrees C., for about 10 to 120 seconds, at a pressure of between about 15 to 100 Torr, e.g., in an $NH_3$ ambient, although other processing conditions may also be used for the anneal process. Other ambient gases may also be used, for example, such as $N_2$, NO, ($N_2+O_2$), or other gases.

The material layers 132, 128 or 130, and 126 and 126' advantageously comprise a dielectric material stack that has a high k value, e.g., of about 25 or greater in some embodiments, for example. In some embodiments, the material layers 132, 128 or 130, and 126 and 126' advantageously comprise a dielectric material stack that has a dielectric constant of about 30 or greater in some embodiments. The combined thickness of the optional oxynitride layer 126 or nitride layer 126', the barrier layer 128 or 130, and the rare earth element-containing material layer 132 preferably about 15 nm or less in accordance with some embodiments of the present invention, for example. Alternatively, the combined thickness of layers 126 or 126', 128 or 130, and 132 may be greater than 15 nm, in other embodiments.

Figure 6:
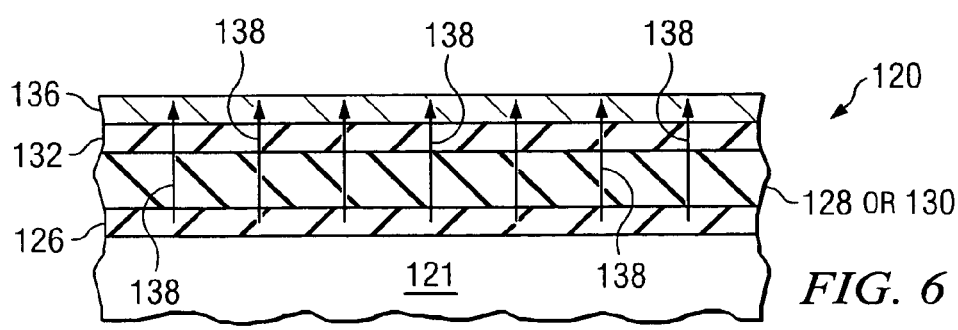

Next, an optional gettering layer 136 is formed over the rare earth element-containing layer 132, as shown in FIG. 6 (step 114). The gettering layer 136 preferably comprises a material such as titanium (Ti) that is adapted to cause oxygen 138 to move upwardly from the oxynitride layer 126 through the barrier layer 128 or 130 and the rare earth element-containing layer 132, for example. The gettering layer 136 preferably comprises a thickness of about 0.5 nm to about 2 nm or less, for example, although the gettering layer 136 may also comprise other dimensions. The oxygen 138 (O) moves up through the layers 128 or 130 and 132, forming $TiO_2$ at the interface of the Ti gettering layer 136. In the gettering process, at least a portion, and in some embodiments, substantially all, of the oxygen from the oxynitride 126 layer is removed, forming a layer 126' comprising a nitride material such as silicon nitride $Si_xN_y$, for example, as shown in FIG. 6. The layer 126' after the gettering layer 136 is deposited may comprise a nitride layer, for example.

Note that the oxynitride layer 126 initially adds to the effective oxide thickness (EOT) of the dielectric stack (e.g., materials 126, 128, and 132). However, the oxynitride layer 126 advantageously provides a good quality starting oxide layer for the deposition process of the diffusion barrier layer 128. Later, if the gettering layer 136 is included, the gettering layer 136 is used to minimize the EOT by reducing the thickness of the oxynitride layer 126, by removing all or some of the oxygen from the oxynitride layer 126 and forming the nitride layer 126', for example.

Figure 7:
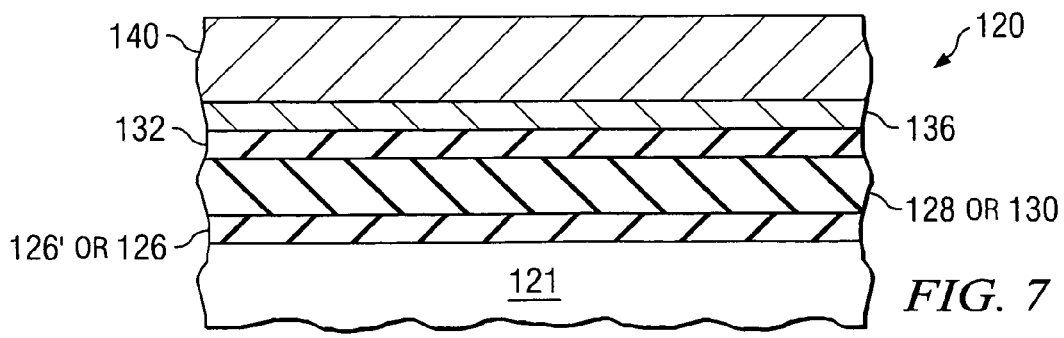

An electrode material 140 is formed over the optional gettering layer 136 (step 116), as shown in FIG. 7. The electrode material 140 preferably comprises a conductive material such as TiN, TaN, Ru, $RuO_2$, TiSiN, TaSiN, HfSiN, TiHfN, TiCN, TaCN, TiXN, AlN, $RE_1RE_2N$, and/or multiple layers or combinations thereof, wherein X comprises a rare earth element, wherein $RE_1RE_2N$ comprises a nitride of a first rare earth element $RE_1$ and a second rare earth element $RE_2$, and wherein the second rare earth element comprises a different rare earth element than the first rare earth element, as examples, although other materials such as a semiconductor material, e.g., polysilicon may also be used. The electrode material 140 preferably comprises a thickness of about 15 nm or less, for example, although the electrode material 140 may also comprise other dimensions. The electrode material 140 is preferably deposited using ALD, although other deposition methods such as CVD, PVD, or other methods may also be used.

Note that in some embodiments, the electrode material 140 is preferably deposited in-situ with the gettering layer 136. For example, the workpiece 121 may be placed in a processing chamber, and without removing the workpiece 121 from the processing chamber, first the gettering layer 136 is formed, and then the electrode material 140 is formed over the gettering layer 136.

Next, the semiconductor device 120 may be annealed (step 118). The optional anneal process preferably comprises a high temperature activation anneal, for example. The anneal process preferably is carried out at temperatures greater than or equal to 1,000° C., for a duration of greater than about 10 seconds, in a nitrogen ambient with up to about 8% oxygen, as an example, although alternatively, the optional final anneal process may comprise other processing parameters.

The various material layers 140, 136, 132, 128 or 130 and 126 or 126' are then patterned into desired shapes for the semiconductor device 120, not shown. For example, the material layers 140 and 136 that are conductive may be patterned in the shape of a capacitor plate, a transistor gate, or other conductive elements or portions of circuit elements, as examples. The material layers 132, 130 or 128, and 126 or 126' comprising the dielectric stack that are insulators may also be patterned, for example, also not shown.

Figure 8:
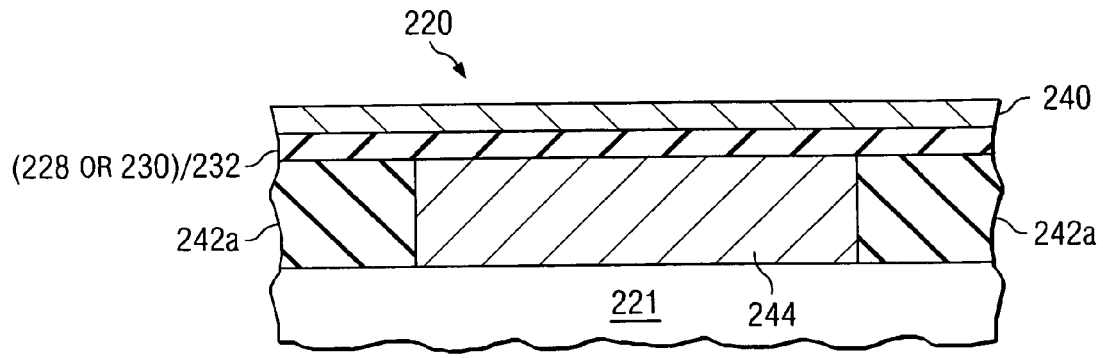
FIGS. 8 and 9 show cross-sectional views of a semiconductor device at various stages of manufacturing, wherein the novel high k dielectric material of embodiments of the present invention is implemented in a metal-insulator-metal (MIM) capacitor structure.
Figure 9:
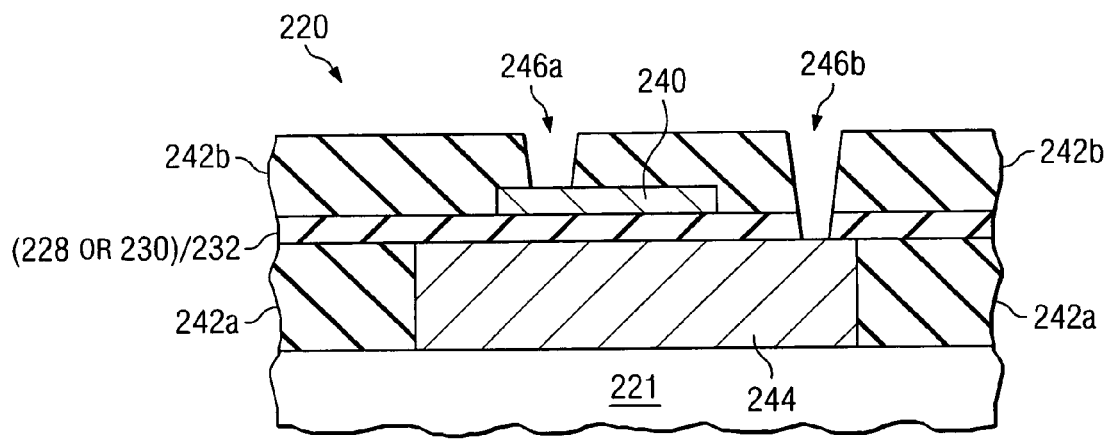

FIGS. 8 and 9 show cross-sectional views of a semiconductor device 220 at various stages of manufacturing, wherein the novel high k dielectric material (228 or 230)/232 of embodiments of the present invention is implemented in a metal-insulator-metal (MIM) capacitor structure, for example. Like numerals are used for the various elements that were described in FIGS. 2 through 7. To avoid repetition, each reference number shown in FIGS. 8 and 9 is not described again in detail herein. Rather, similar materials x21, x28, x30, x32, etc . . . are preferably used for the various material layers shown as were described for FIGS. 2 through 7, where x=1 in FIGS. 2 through 7 and x=2 in FIGS. 8 and 9.

To form the MIM capacitor, a bottom capacitor plate 244 is formed over a workpiece 221. The bottom plate may comprise a semiconductive material such as polysilicon, or a conductive material such as TiN, TaN, TiTaN, Ru, $Ru_xO$, TiHfN, TiCN, TaCN, TiXN, AlN, $Re_1Re_2N$, copper and/or aluminum, as examples. The bottom capacitor plate 244 may be formed in an insulating material 242a that may comprise an inter-level dielectric layer (ILD), for example. The bottom capacitor plate 244 may include liners and barrier layers, for example, not shown.

The novel high k dielectric material (228 or 230)/232 described with reference to FIGS. 1 through 7 is formed over the bottom plate 244 and the insulating material 242a. An oxynitride layer 126 or nitride layer 126' and a gettering layer 136 as shown in FIG. 7 may also be included in the structure, for example (not shown in FIG. 8). An electrode material 240 is formed over the dielectric material (228 or 230)/232, as shown in FIG. 8, and the electrode material 240 (and also the gettering layer 136 if included, not shown) is patterned to form a top capacitor plate, as shown in FIG. 9. An additional insulating material 242b may be deposited over the top capacitor plate 240, and the insulating material 242b (and also the diffusion barrier layer 228 or 230 and the rare earth element-containing layer 232) may be patterned with patterns 246a and 246b for contacts that will make electrical contact to the top plate 240 and the underlying bottom plate 244, respectively. The insulating material 242b may be filled in later with a conductive material to form the contacts in patterns 246a and 246b, for example, not shown.

Thus, in FIG. 9, a capacitor is formed that includes the two conductive plates 244 and 240 separated by an insulator which comprises the novel high k dielectric material (228 or 230)/232 (and optional nitride layer 126' or oxynitride layer 126 shown in FIG. 7) of embodiments of the present invention. The capacitor may be formed in a front-end-of the line (FEOL), or portions of the capacitor may be formed in the back-end-of the line (BEOL), for example. One or both of the capacitor plates 224 and 240 may be formed in a metallization layer of the semiconductor device 220, for example. Capacitors such as the one shown in FIG. 9 may be used in filters, in analog-to-digital converters, memory devices, control applications, and many other types of applications, for example.

Figure 10:
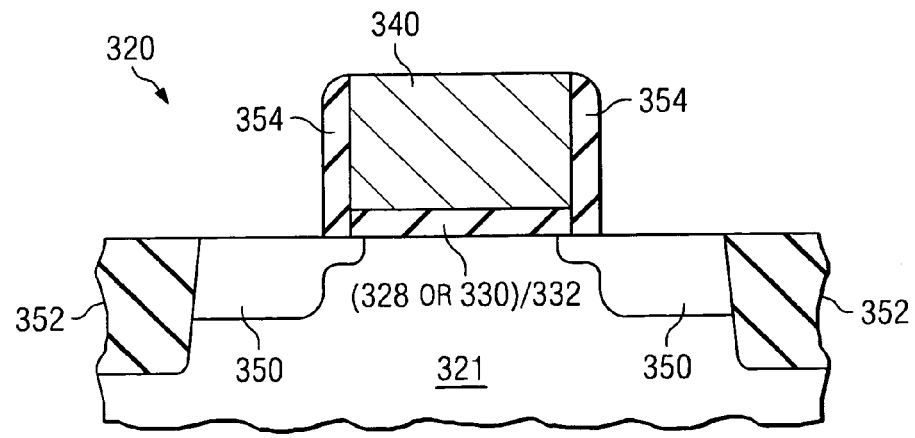
FIG. 10 shows a cross-sectional view of a semiconductor device, wherein the novel high k dielectric material of embodiments of the present invention is implemented in a transistor structure.

FIG. 10 shows a cross-sectional view of a semiconductor device 320, wherein the novel high k dielectric material (328 or 330)/332 of embodiments of the present invention is implemented in a transistor structure as a gate dielectric (328 or 330)/332. Again, like numerals are used for the various elements that were used to describe the previous figures, and to avoid repetition, each reference number shown in FIG. 10 is not described again in detail herein. Note that in this embodiment, a nitride layer 126' or oxynitride layer 126 (not shown; see FIG. 7) maybe disposed between the workpiece 321 and the high k material layer (328 or 330)/332, and a gettering layer 136 (see FIG. 7) may also be included (not shown).

The transistor includes a gate dielectric comprising the novel high k dielectric material layer (328 or 330)/332 (and optional nitride layer 126' or oxynitride layer 126 shown in FIG. 7) described herein and a gate electrode 340 formed over the high k dielectric material layer (328 or 330)/332. Source and drain regions 350 are formed proximate the gate electrode 340 in the workpiece 321, and a channel region is disposed between the source and drain regions 350 in the workpiece 321. The transistor may be separated from adjacent devices by shallow trench isolation (STI) regions 352, and insulating spacers 354 may be formed on sidewalls of the gate electrode 340 and the gate dielectric (328 or 330)/332, as shown.

Figure 11:
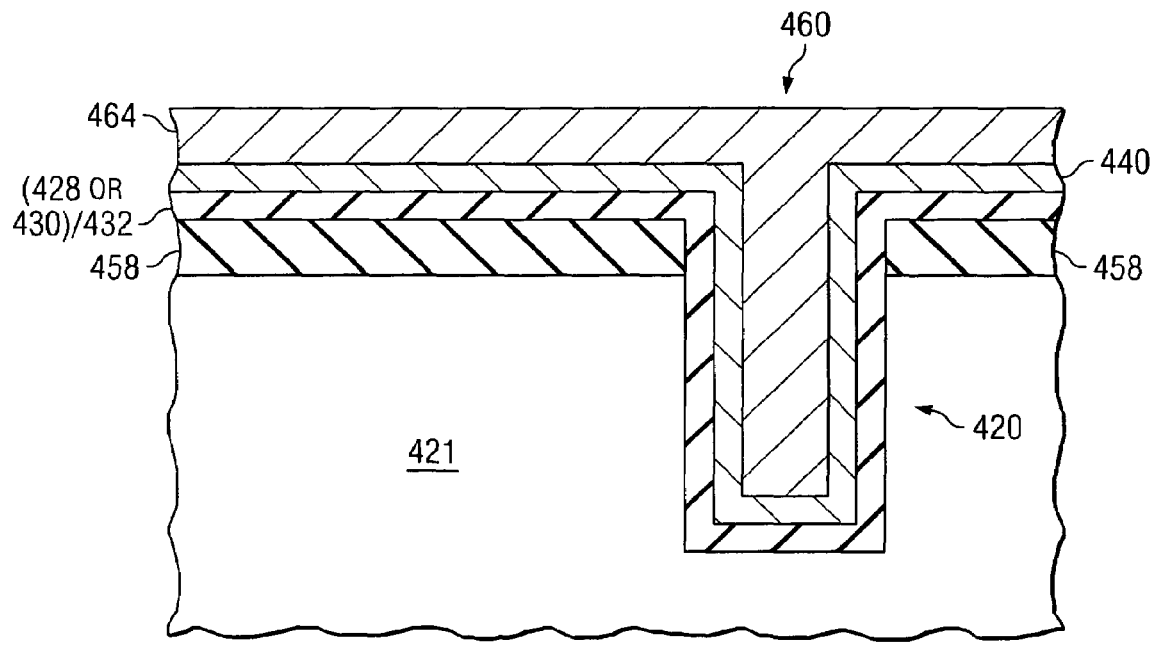
FIGS. 11 and 12 show cross-sectional views of a semiconductor device at various stages of manufacturing, wherein the novel high k dielectric material of embodiments of the present invention is implemented in a DRAM structure.
Figure 12:
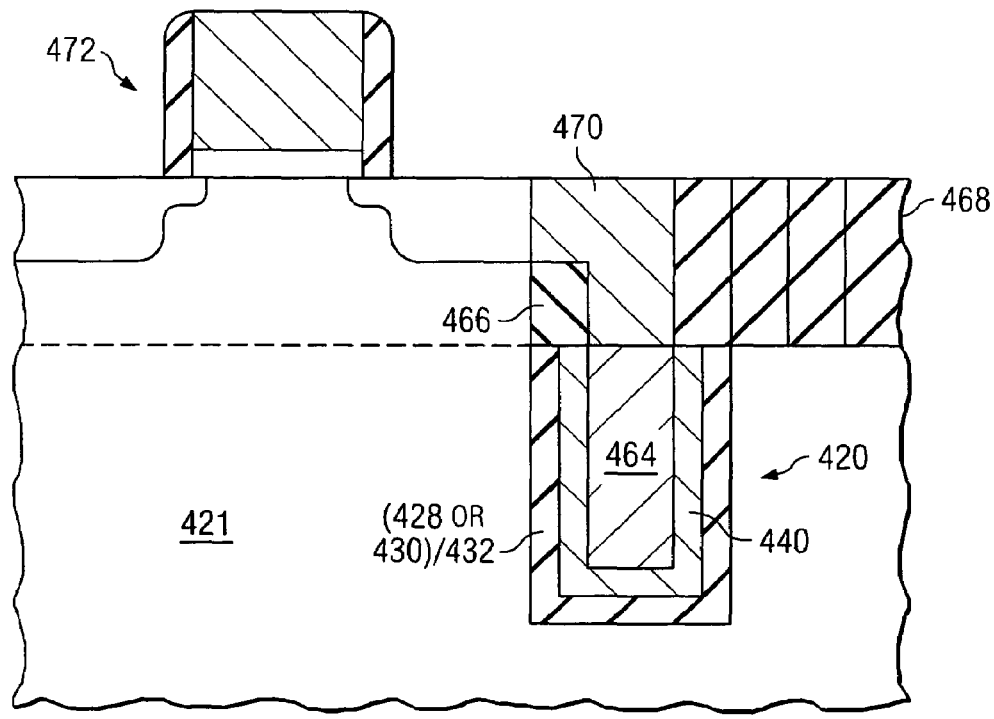

FIGS. 11 and 12 show cross-sectional views of a semiconductor device 420 at various stages of manufacturing, wherein the novel high k dielectric material (428 or 430)/432 (and optional nitride layer 126' or oxynitride layer 126 shown in FIG. 7) of embodiments of the present invention is implemented in a DRAM structure. To form a DRAM memory cell comprising a storage capacitor utilizing the novel high k dielectric material (428 or 430)/432 of embodiments of the present invention, a sacrificial material 458 comprising an insulator such as a hard mask material is deposited over a workpiece 421, and deep trenches 460 are formed in the sacrificial material 458 and the workpiece 421. The novel high k dielectric material layer (428 or 430)/432 is formed over the patterned sacrificial material 458 and workpiece 421, and an electrode material 440 is formed over the high k dielectric material layer (428 or 430)/432, as shown. An additional electrode material 464 comprising polysilicon e.g., that may be doped with n or p-type doping, for example, or other semiconductor or conductive material may be deposited over the electrode material 440 to fill the trenches 460, as shown in FIG. 11.

Next, excess amounts of electrode materials 464 and 440 and dielectric materials (428 or 430)/432 are removed from over the top surface of the workpiece 421, e.g., using a chemical mechanical polish (CMP) process and/or etch process. The materials 464 and 440, and high k dielectric material layer (428 or 430)/432 are also recessed below the top surface of the workpiece 421, for example. The sacrificial material 458 is also removed, as shown in FIG. 12.

An oxide collar 466 may be formed by thermal oxidation of exposed portions of the trench 460 sidewalls. The trench 460 may then be filled with a conductor such as polysilicon 470. Both the polysilicon 470 and the oxide collar 466 are then etched back to expose a sidewall portion of the workpiece 421 which will form an interface between an access transistor 472 and the capacitor formed in the deep trench 460 in the workpiece 421, for example.

After the collar 466 is etched back, a buried strap may be formed at 470 by deposition of a conductive material, such as doped polysilicon. Regions 464 and 470 comprising polysilicon are preferably doped with a dopant such as arsenic or phosphorus, for example. Alternatively, regions 464 and 470 may comprise a conductive material other than polysilicon (e.g., a metal).

The strap material 470 and the workpiece 421 may then be patterned and etched to form STI regions 468. The STI regions 468 may be filled with an insulator such as an oxide deposited by a high density plasma process (i.e., HDP oxide). The access transistor 472 may then be formed to create the structure shown in FIG. 12.

The workpiece 421 proximate the high k dielectric material layer (428 or 430)/432 lining the deep trench 460 comprises a first capacitor plate, the high k dielectric material layer (428 or 430)/432 comprises a capacitor dielectric, and materials 440 and 464 comprise a second capacitor plate of the deep trench storage capacitor of the DRAM memory cell. The access transistor 472 is used to read or write to the DRAM memory cell, e.g., by the electrical connection established by the strap 470 to a source or drain of the transistor 472 near the top of the deep trench 460, for example.

Embodiments of the present invention may also be implemented in other structures that require a dielectric material. For example, the novel high k dielectric material layers described herein may be implemented in planar transistors, vertical transistors, planar capacitors, stacked capacitors, vertical capacitors, deep or shallow trench capacitors, and other devices. Embodiments of the present invention may be implemented in stacked capacitors where both plates reside above a substrate or workpiece, for example.

Advantages of embodiments of the present invention include providing novel methods and structures having a high dielectric constant or k value. The high k dielectric materials described herein utilize rare earth elements or rare earth oxides to form high dielectric constant materials. The high k materials are thermally stable and result in capacitors having a low effective oxide thickness (EOT) and low leakage current, for example. The use of the novel barrier layer 128 or 130 described herein prevents formation of a rare earth silicate proximate the workpiece 121, which may occur due to counter diffusion of Si with a subsequently deposited rare earth element-containing material 132, if a rare earth element-containing material such as layer 132 were to be deposited directly adjacent to the workpiece 121, for example.

The novel high k materials described herein provide the ability to reduce the EOT below about 1.5 nm with a leakage current of less than about $1 \times 10^{-7}$ A/cm$^2$, e.g., which is advantageous in applications having thermal budgets of about 1,000° C. for 30 seconds, as an example. By eliminating the possibility of formation of a rare element silicate of silicide by the use of the novel barrier layer 128 or 130, advantageously, rare earth element-doped high dielectric constant material layers such as Hf or Zr oxides can be used for the rare earth element-containing material 132 of embodiments of the present invention, advantageously resulting in the formation of low leakage, low EOT capacitors having excellent thermal stability, for example.

Furthermore, the use of an optional titanium gettering layer 136 enhances the dielectric constant of the high k dielectric material, while further minimizing the effective oxide thickness (EOT).

Another benefit of embodiments of the present invention is providing the ability to fine tune the phases and composition of the film dielectric stack (e.g., layers 126 or 126', 128 or 130, and 132), e.g., by varying the amount of rare earth element doped into a transition metal oxide, or by varying the amount of transition metal doped into the rare earth oxide, of the rare earth element-containing material 132, for example.

The entire dielectric stack of the high k materials described herein, including the rare earth element-containing material 132, the diffusion barrier layer 128 or nitrided diffusion barrier layer 130, and optionally also the nitride layer 126' or oxynitride layer 126, advantageously may have a dielectric constant of about 25 or greater in some embodiments, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:
   providing a workpiece;
   forming a barrier layer over the workpiece;
   before forming the barrier layer over the workpiece, forming a layer of oxide over the workpiece, and exposing the layer of oxide to nitrogen to form an oxynitride layer;
   forming a rare earth element-containing insulating material layer over the barrier layer, wherein at least the barrier layer and the rare earth element-containing insulating material layer comprise a dielectric material; and
   forming a gettering layer over the rare earth element-containing insulating material layer, wherein forming the gettering layer comprises causing at least a portion of oxygen of the oxynitride layer to move through the barrier layer and the rare earth element-containing insulating material and combine with a material of the gettering layer.

2. The method according to claim 1, wherein forming the barrier layer comprises forming a layer of $HfO_2$, $HfSiO$, or $Al_2O_3$.

3. The method according to claim 1, wherein forming the rare earth element-containing insulating material layer comprises forming at least one material layer comprising $TiO_2$, $Ta_2O_5$, or a bilayer of $TiO_2$ and $Ta_2O_5$, and doping the at least one material layer with a rare earth oxide comprising one or more rare earth elements.

4. The method according to claim 3, wherein doping the at least one material layer with the rare earth oxide comprises doping the at least one material layer with about 30% or less of the rare earth oxide.

5. The method according to claim 1, further comprising, before forming the barrier layer over the workpiece, forming a layer of oxide over the workpiece, and exposing the layer of oxide to nitrogen to form an oxynitride layer.

6. The method according to claim 1 further comprising forming an electrode over the rare earth element-containing insulating material layer, wherein the electrode comprises TiN, TaN, Ru, $RuO_2$, TiSiN, TaSiN, HfSiN, TiHfN, TiCN, TaCN, TiXN, AlN, $RE_1RE_2N$, and/or multiple layers or combinations thereof, wherein X comprises a rare earth element, wherein $RE_1RE_2N$ comprises a nitride of a first rare earth element $RE_1$ and a second rare earth element $RE_2$, and wherein the second rare earth element $RE_2$ comprises a different rare earth element than the first rare earth element $RE_1$.

* * * * *